US009590587B1

(12) United States Patent
Thalmayr et al.

(10) Patent No.: US 9,590,587 B1
(45) Date of Patent: Mar. 7, 2017

(54) COMPENSATION OF SECOND ORDER TEMPERATURE DEPENDENCE OF MECHANICAL RESONATOR FREQUENCY

(75) Inventors: Florian Thalmayr, Cambridge, MA (US); Jan H. Kuypers, Cambridge, MA (US); Andrew Sparks, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 311 days.

(21) Appl. No.: 13/542,221

(22) Filed: Jul. 5, 2012

Related U.S. Application Data

(60) Provisional application No. 61/505,456, filed on Jul. 7, 2011.

(51) Int. Cl.
*H03H 9/05* (2006.01)
*H03H 3/04* (2006.01)

(52) U.S. Cl.
CPC ............. *H03H 9/059* (2013.01); *H03H 3/04* (2013.01)

(58) Field of Classification Search
CPC . H03H 9/059; H03H 3/08; H03H 3/04; H01L 41/053
USPC ...................... 310/321, 313 R, 346
See application file for complete search history.

(56) References Cited

U.S. PATENT DOCUMENTS

| | | | |
|---|---|---|---|
| 5,592,010 A | 1/1997 | Kakumu et al. | |
| 5,922,218 A | 7/1999 | Miyata et al. | |
| 6,972,510 B2 | 12/2005 | Klee et al. | |
| 7,586,239 B1 * | 9/2009 | Li | H03H 3/0072 310/323.02 |
| 7,812,692 B2 * | 10/2010 | Ayazi et al. | 333/187 |
| 7,834,524 B2 | 11/2010 | Wang et al. | |
| 8,058,769 B2 | 11/2011 | Chen et al. | |
| 8,111,114 B2 * | 2/2012 | Bhave et al. | 333/186 |
| 8,362,675 B2 | 1/2013 | Chen et al. | |
| 8,742,854 B1 | 6/2014 | Lee et al. | |
| 9,013,088 B1 | 4/2015 | Sparks et al. | |
| 2002/0189664 A1 * | 12/2002 | Ishihara | H01L 31/03682 136/258 |
| 2004/0021403 A1 | 2/2004 | Ayazi et al. | |
| 2004/0065940 A1 | 4/2004 | Ayazi et al. | |
| 2005/0241395 A1 | 11/2005 | Takahashi et al. | |
| 2006/0044078 A1 | 3/2006 | Ayazi et al. | |
| 2006/0125576 A1 | 6/2006 | Ho et al. | |
| 2008/0003770 A1 | 1/2008 | Enomoto et al. | |

(Continued)

OTHER PUBLICATIONS

Samarao et al., "Intrinsic Temperature Compensation of Highly Resistive High-Q Silicon Microresonators via Charge Carrier Depletion," FCS-IEEE International Frequency Control Symposium 2010, pp. 334-339.

(Continued)

*Primary Examiner* — Shawki S Ismail
*Assistant Examiner* — Bryan Gordon
(74) *Attorney, Agent, or Firm* — Wolf, Greenfield & Sacks, P.C.

(57) ABSTRACT

Apparatus and methods for control of the second order temperature dependence of the frequency of a mechanical resonating structure are described. The second order temperature dependence of frequency of the mechanical resonating structure may be non-linear. Control may be provided by doping of a semiconductor layer of the mechanical resonating structure.

17 Claims, 10 Drawing Sheets

(56) References Cited

U.S. PATENT DOCUMENTS

| | | | |
|---|---|---|---|
| 2008/0072408 A1* | 3/2008 | Sano | H01L 41/316 29/25.35 |
| 2008/0186109 A1 | 8/2008 | Ho et al. | |
| 2008/0246559 A1 | 10/2008 | Ayazi et al. | |
| 2008/0284542 A1* | 11/2008 | Sano et al. | 333/187 |
| 2008/0297281 A1* | 12/2008 | Ayazi et al. | 333/192 |
| 2010/0038991 A1 | 2/2010 | Shih et al. | |
| 2010/0066467 A1* | 3/2010 | Ayazi | H03H 9/172 333/187 |
| 2010/0127596 A1 | 5/2010 | Ayazi et al. | |
| 2010/0127798 A1 | 5/2010 | Ayazi et al. | |
| 2010/0171570 A1 | 7/2010 | Chandrahalim et al. | |
| 2010/0181868 A1* | 7/2010 | Gaidarzhy | H03H 9/02228 310/313 B |
| 2010/0182102 A1 | 7/2010 | Kuypers et al. | |
| 2010/0244624 A1 | 9/2010 | Matsuda et al. | |
| 2010/0308927 A1 | 12/2010 | Rebel et al. | |
| 2010/0314969 A1 | 12/2010 | Bahreyni et al. | |
| 2010/0319185 A1 | 12/2010 | Ayazi et al. | |
| 2011/0050366 A1 | 3/2011 | Ayazi et al. | |
| 2011/0240617 A1 | 10/2011 | Xu et al. | |
| 2011/0279201 A1* | 11/2011 | Pensala | H03H 3/0076 333/219.1 |
| 2012/0074810 A1 | 3/2012 | Chen et al. | |
| 2013/0021304 A1 | 1/2013 | Zuo et al. | |
| 2013/0099629 A1 | 4/2013 | Ayazi et al. | |

OTHER PUBLICATIONS

Keyes, R.W., "Electronic Effects in the Elastic Properties of Semiconductors," *Solid State Physics* 20:37-90 (1968).

Akiyama et al., Enhancement of Piezoelectric Response in Scandium Aluminum Nitride Alloy This Films Prepared by Dual Reactive Cosputtering. Adv Mater. 2009;21:593-6.

Jaakkola et al., Temperature compensated resonance modes of degenerately n-doped silicon MEMS resonators. Freq Control Symp. 2012 IEEE Intl. May 21-24, 2012;1-5.

Pensala et al., Bulk acoustic wave propagation characteristics in degenerately n-doped Si. Freq Control Symp. 2012 IEEE Intl. May 21-24, 2012;1-4.

Pensala et al., Temperature compensation of silicon MEMS Resonators by Heavy Doping. Ultrason Symp. 2011 IEEE Intl. Oct. 18-21, 2011;1952-5.

Samarao, Temperature compensation of silicon micromechanical resonators via degenerate doping. Electron Devices Meeting. 2009 IEEE Intl. Dec. 7-9, 2009;1-4.

Office communication mailed Feb. 17, 2015 for U.S. Appl. No. 13/542,200.

Office communication mailed Oct. 6, 2015 for U.S. Appl. No. 13/679,385.

\* cited by examiner

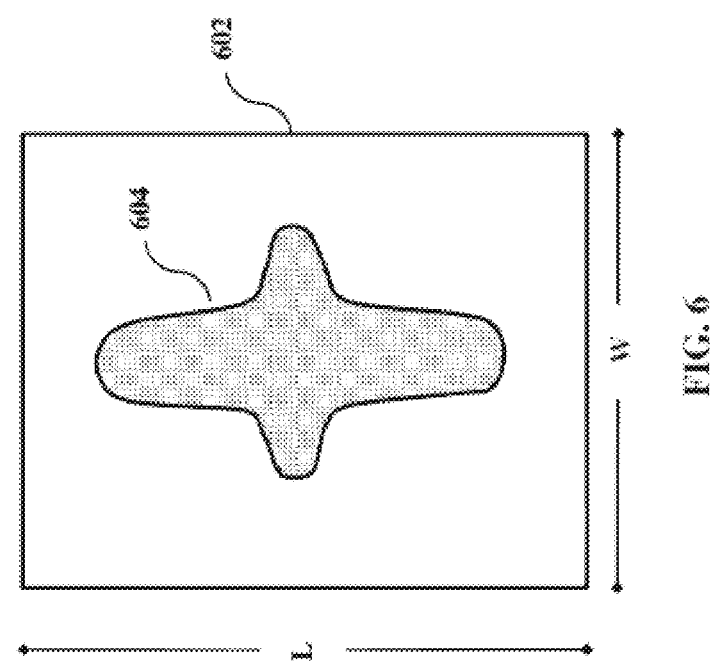

COMPENSATION OF SECOND ORDER TEMPERATURE DEPENDENCE OF MECHANICAL RESONATOR FREQUENCY

RELATED APPLICATIONS

This application claims the benefit under 35 U.S.C. §119(e) of U.S. Provisional Application Ser. No. 61/505,456 filed Jul. 7, 2011 entitled "Compensation Of Second Order Temperature Dependence Of Mechanical Resonator Frequency," the entire contents of which is incorporated herein by reference.

BACKGROUND

Field

The technology described herein relates to mechanical resonating structures, and related methods.

Related Art

Micromechanical resonators are small mechanical structures that are designed to vibrate at a desired resonance frequency and/or with a desired mode shape, and are used in oscillators, electromechanical filters, and inertial sensors, among other items. Resonators may be excited electrically to achieve desirable vibration amplitude. Transduction may be achieved through electrostatic, piezoelectric, piezoresistive, thermal, electromagnetic, or other mechanisms. Often, drive and detection/sense functions are combined to allow the insertion of the resonator into an electrical circuit.

A common material used for the construction of microelectromechanical systems (MEMS) resonators is silicon. Single crystal silicon, in particular, has many advantages, including high material quality factor, inherent stability of the material, the existence of specialized manufacturing processes, and low cost. Silicon, as well as other materials of a mechanical resonating structure, can exhibit temperature dependent mechanical properties.

SUMMARY

According to a first aspect, a mechanical resonating structure is provided, comprising a piezoelectric material active layer, a plurality of electrodes configured to actuate the piezoelectric material active layer by applying thereto an excitation signal, and a semiconductor layer coupled to the piezoelectric material active layer and coupled to a substrate by at least one anchor. The semiconductor layer is doped so that a mode of vibration of the mechanical resonating structure has a second order temperature coefficient of frequency (TCF) that is substantially zero.

According to another aspect, a method of manufacturing a mechanical resonating structure having a piezoelectric active layer and a semiconductor layer is provided. The method comprises doping the semiconductor layer to a level sufficient to give the mechanical resonating structure a second order temperature coefficient of frequency (TCF) that is substantially zero for at least one mode of vibration. In some embodiments, the at least one mode of vibration is a primary mode of vibration.

According to another aspect, a method of manufacturing a mechanical resonating structure having a piezoelectric active layer and a semiconductor layer is provided. The method comprises stressing at least one component of the mechanical resonating structure to a level sufficient to give the mechanical resonating structure a second order temperature coefficient of frequency (TCF) that is substantially zero for at least one mode of vibration. In some embodiments, the at least one mode of vibration is a primary mode of vibration.

BRIEF DESCRIPTION OF DRAWINGS

Various aspects and embodiments of the technology will be described with reference to the following figures. It should be appreciated that the figures are not necessarily drawn to scale. Items appearing in multiple figures are indicated by the same or similar reference number in all the figures in which they appear.

FIG. 6 illustrates a top view of a mechanical resonating structure have a laterally non-uniform doping pattern, according to one non-limiting embodiment.

DETAILED DESCRIPTION

Figure 1A:
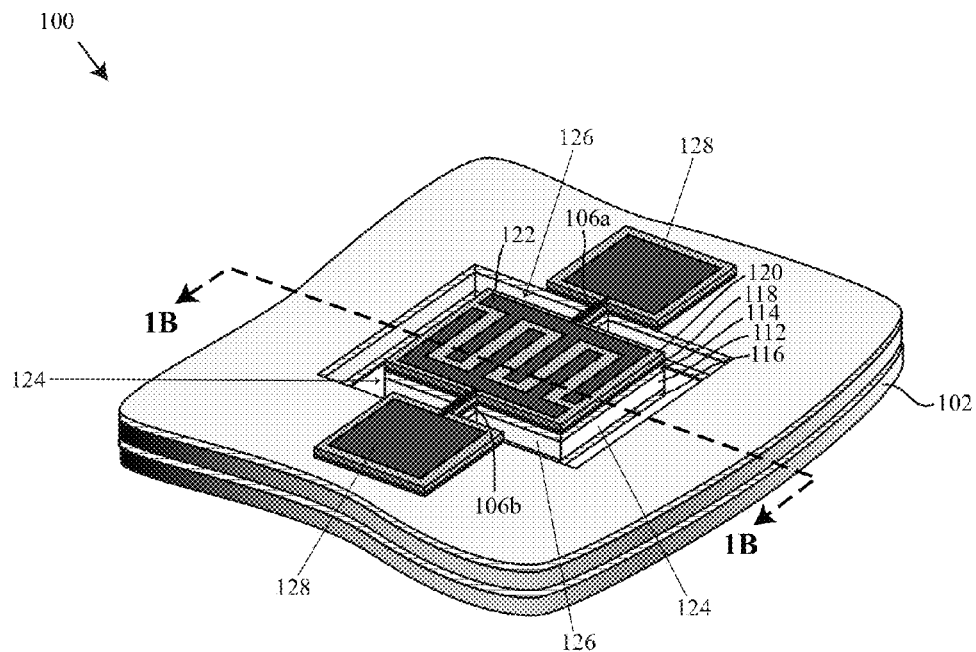
FIGS. 1A and 1B illustrate a perspective view and a cross-sectional view, respectively, of a resonating structure as may be used according to various aspects described herein.

Mechanical resonating structures often exhibit temperature dependent behavior, in that the frequency of operation, or the resonance frequency, of the mechanical resonating structure may vary with temperature. The temperature stability of a mechanical resonator may be quantified as the temperature coefficient of frequency (TCF), which is expressed as:

$$TCF = \frac{\partial f}{\partial T} \frac{1}{f},$$

where f is the resonance frequency and T is the temperature. A term that is used to quantify the stiffness component of the temperature stability of a mechanical resonator (which is one of the primary contributors to TCF) is the temperature coefficient of stiffness (TCC), which can be expressed as:

$$TCC = \frac{\partial C_{\it eff}}{\partial T} \frac{1}{C_{\it eff}}$$

where $C_{\it eff}$ is the effective stiffness coefficient of the resonator with regard to a specific mode of resonance.

The temperature dependent frequency instability of a mechanical resonator may be due to multiple sources, a significant one of which (and sometimes the dominant source) may be temperature dependent variations in the mechanical properties of the materials of the mechanical resonating structure, as indicated above. For example, certain materials may stiffen or soften with temperature changes, i.e., they have a positive or negative TCC, causing a corresponding change in the frequency of vibration in the material. Such temperature dependent changes in the frequency (i.e., the TCF) of a mechanical resonating structure may include a first order linear contribution TCF1, a second order quadratic contribution TCF2, and a third order contribution TCF3. Various techniques exist for compensating the first order linear contribution. The present application describes techniques for specifically addressing the second order quadratic contribution (TCF2).

According to a first aspect of the present application, a component of a mechanical resonating structure is doped with a type and level of doping sufficient to compensate for the intrinsic/undoped second order temperature dependent frequency changes of the mechanical resonating structure. In a non-limiting embodiment, the mechanical resonating structure comprises a semiconductor layer, and the semiconductor layer may be the component doped suitably (e.g., between $1 \cdot 10^{16}$ and $5 \cdot 10^{21}$ cm$^{-3}$ donors or acceptors, between $1 \cdot 10^{19}$ and $1 \cdot 10^{21}$ cm$^{-3}$ donors or acceptors, or any other suitable doping concentration, as a non-limiting example) to compensate the second order temperature dependent frequency behavior of part or all of the mechanical resonating structure. According to one non-limiting embodiment, the semiconductor layer is a silicon layer. Alternative techniques to those used to compensate the second order temperature-dependent frequency behavior may additionally be used to compensate for the linear first order temperature dependent frequency behavior of the mechanical resonating structure, such that the mechanical resonating structure may exhibit substantially temperature independent operation over a wide range of temperatures (e.g., less than approximately 100 parts per million (ppm) variation in frequency, less than approximately 50 ppm, less than approximately 30 ppm, less than approximately 10 ppm, less than approximately 5 ppm, or any other suitable number).

According to other aspects of the present application, techniques other than doping may be used to compensate the second order temperature dependent behavior of a mechanical resonating structure. Such alternative techniques may include ion implantation, internal or external stressing of components of the mechanical resonating structure to cause material and geometric stiffening and softening, dielectric polarization, and/or annealing, each of which is described below.

The aspects described above, as well as additional aspects, are described further below. These aspects may be used individually, all together, or in any combination of two or more, as the technology is not limited in this respect.

Figure 1B:
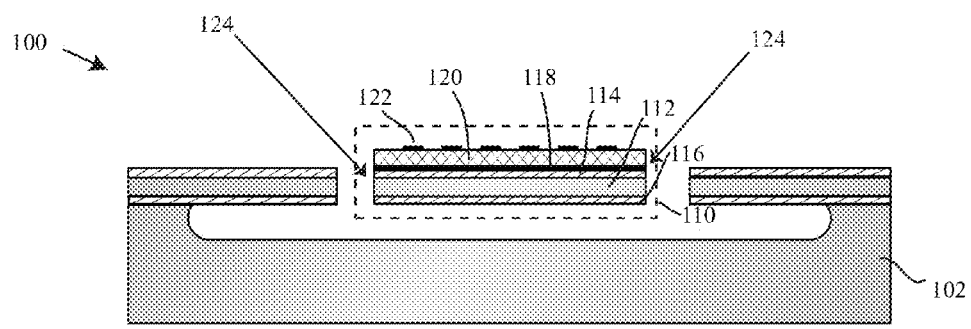

A non-limiting example of a mechanical resonating structure to which aspects of the present invention may apply is illustrated in FIGS. 1A and 1B and now described. However, it should be appreciated that the various aspects are not limited to the type of mechanical resonating structures shown herein, but rather that other types of mechanical resonating structures may be used, and that the structure of FIGS. 1A and 1B is provided for purposes of explanation.

FIGS. 1A and 1B provide a perspective view and a cross-sectional view, respectively, of a device 100 including a mechanical resonating structure 110 (reference number shown in FIG. 1B). As illustrated, the micromechanical resonating structure 110 may include an active layer 120 (e.g., a piezoelectric layer, for example made of aluminum nitride, or any other suitable piezoelectric material), a conducting layer 118 (e.g., a metal electrode), and one or more electrodes 122 (which in some embodiments may be configured as top electrodes, and in some embodiments may form one or more interdigitated transducers (IDT)). A contact pad 128 may provide electrical access to the electrodes 122. The conducting layer 118 may, in some embodiments, be configured as an electrode, and may therefore in some embodiments be considered a bottom electrode. Electrical access to the conducting layer may be provided by a portion of the conducting layer located below the contact pad 128. For example, the portion of the conducting layer located below the contact pad 128 may be made larger than the contact pad 128, allowing for separate electrical contact to be made to the contact pad 128 and the portion of the conducting layer 118 located below the contact pad. Alternatively, a separate contact pad (e.g., next to contact pad 128 or in any other suitable location), may provide electrical access to the conducting layer 118. The active layer 120 may be actuated by applying a voltage/electric field thereto using electrodes 122 (formed, for example, of a metal) and conducting layer 118, which in some embodiments may be configured as a ground plane. Not all the illustrated components are required and other components may be included in some embodiments, as the illustration provides a non-limiting example of a mechanical resonating structure.

The micromechanical resonating structure 110 also includes a silicon layer 112, a silicon oxide layer 114 on the top surface of the silicon layer 112, and a silicon oxide layer 116 on the bottom surface of the silicon layer 112. The combination of silicon layer 112 and silicon oxide layers 114 and 116 may operate as a temperature compensation structure (a temperature compensation stack in this configuration) to compensate temperature-induced changes in the frequency of operation of micromechanical resonating structure 110, as described further below. It should be appreciated that the silicon layer 112 may be formed of any suitable semiconductor material, and that silicon is a non-limiting example described herein for purposes of illustration. Non-limiting alternatives include germanium, gallium arsenide, or other semiconductor materials. Thus, the use of silicon for layer 112 is not limiting. Similarly, layers 114 and 116 may be formed of any suitable material (e.g., other types of oxide than silicon oxide), as silicon oxide is a non-limiting example described herein for purposes of illustration. Also, as mentioned, not all the illustrated components are required and other components may be included in some embodiments, as the illustration provides a non-limiting example of a mechanical resonating structure. For example, in some embodiments only a single oxide layer 114 or 116 may be included, rather than both. Other alternatives are also possible.

The micromechanical resonating structure may be connected to a substrate 102 by two or more anchors. As shown in FIG. 1A, the micromechanical resonating structure 110 is connected to the substrate 102 by two anchors, 106a and 106b, which may be flexible in some embodiments. The number of anchors is not limiting, as any suitable number may be used. It should further be understood that the geometry of the anchors may be matched to a specific length to reduce the amount of acoustic energy transferred from the micromechanical resonating structure to the substrate. Suitable anchor structures that reduce stress and inhibit energy loss are described in U.S. patent application Ser. No. 12/732,575, filed Mar. 26, 2010, published as U.S. Patent Publication No. 2010/0314969 and entitled "Mechanical Resonating Structures and Methods", which is hereby incorporated herein by reference in its entirety.

As mentioned, various types and forms of mechanical resonating structures may be used with the aspects of the present application, and FIGS. 1A and 1B provide only a non-limiting example. For example, the mechanical resonating structure may comprise or be formed of any suitable material(s) and may have any composition. According to some embodiments, the mechanical resonating structure may comprise a piezoelectric material (e.g., active layer 120). According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material, although in other embodiments including a piezoelectric material the piezoelectric material may be polycrystalline.

The mechanical resonating structure may have any shape, as the shape illustrated in FIGS. 1A and 1B is a non-limiting example. For example, aspects of the technology may apply to mechanical resonating structures that are substantially rectangular, substantially ring-shaped, substantially disc-shaped, or that have any other suitable shape. As additional, non-limiting examples, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Moreover, the mechanical resonating structure may have one or more beveled edges. According to some embodiments, the mechanical resonating structure may be substantially planar. Moreover, geometrical and structural alterations can be made to improve quality (e.g., Q-factor, noise) of a signal generated by the mechanical resonating structure.

The mechanical resonating structures described herein may have any suitable dimensions, and in some embodiments may be micromechanical resonating structures. A mechanical resonating structure may have any suitable thickness, T, and in some embodiments the thickness may be related to a wavelength of a desired oscillation mode. According to a non-limiting embodiment, the thickness T may be less than $2\lambda$, less than $\lambda$, less than $\frac{1}{2}\lambda$, less than $\frac{1}{4}\lambda$, less than $\frac{1}{8}\lambda$, or any other suitable value, where $\lambda$ is a wavelength of operation of the mechanical resonating structure (e.g., a wavelength of a resonance mode of interest of a mechanical resonating structure, an acoustic wavelength of a Lamb wave of interest, etc.). According to a non-limiting embodiment, the mechanical resonating structure may be configured to support Lamb waves, and T may be less than $\lambda$, less than $\frac{1}{2} \lambda$, or have any other suitable value.

According to some embodiments, the mechanical resonating structures described herein have a large dimension (e.g., the largest of length, width, diameter, circumference, etc. of the mechanical resonating structure) of less than approximately 1000 microns, less than approximately 100 microns, less than approximately 50 microns, or any other suitable value. It should be appreciated that other sizes are also possible. According to some embodiments, the devices described herein form part or all of a microelectromechanical system (MEMS).

The mechanical resonating structures may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the listed frequencies are not limiting.

The mechanical resonating structures may be operated in various acoustic modes, including but not limited to Lamb waves, also referred to as plate waves including flexural modes, bulk acoustic waves, surface acoustic waves, extensional modes, translational modes and torsional modes. The selected mode may depend on a desired application of the mechanical resonating structure.

The mechanical resonating structure may be actuated and/or detected in any suitable manner, with the particular type of actuation and/or detection depending on the type of mechanical resonating structure, the desired operating characteristics (e.g., desired mode of operation, frequency of operation, etc.), or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure serving as reflectors for the waves. For such devices, the spacing between the edges of the resonating structure may define the resonance cavity, and resonance may be achieved when the cavity is an integer multiple of pitch p, where $p=\lambda/2$, with $\lambda$ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

As should be appreciated from FIGS. 1A and 1B, in some embodiments suspended mechanical resonating structures are used, meaning that the mechanical resonating structure(s) may have one or more free sides. Referring to FIG. 1A, the micromechanical resonating structure 110 has free ends 124 and the sides 126 are also substantially free, connected to the substrate 102 by anchors 106a and 106b.

As mentioned, the resonance frequency of mechanical resonating structures is temperature dependent. The resonance frequency of any mechanical resonating structure may be a function of the operating temperature, and in particular the temperature dependence of the stiffness coefficients of materials of the mechanical resonating structure, density of the materials, thermal expansion of the materials and temperature related induced stresses.

Figure 2A:
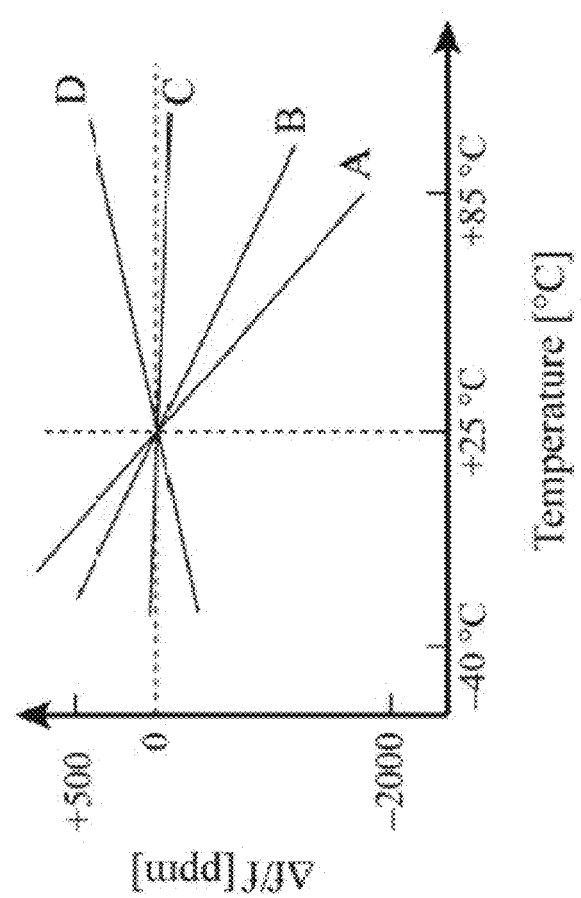
FIGS. 2A-2C illustrate various curves relating to the temperature dependent frequency behavior of a mechanical resonating structure.

FIG. 2A illustrates exemplary temperature dependent frequency behavior for four different resonating structures, represented by lines A-D. The x-axis represents temperature in degrees Celsius. The y-axis represents the frequency change Δf/f in parts per million (ppm). The resonating structures may be MEMS resonators. As shown, the change in frequency may be more than 2000 parts per million (ppm) over the operating temperature range from −40° C. to +85° C.

Figure 2B:
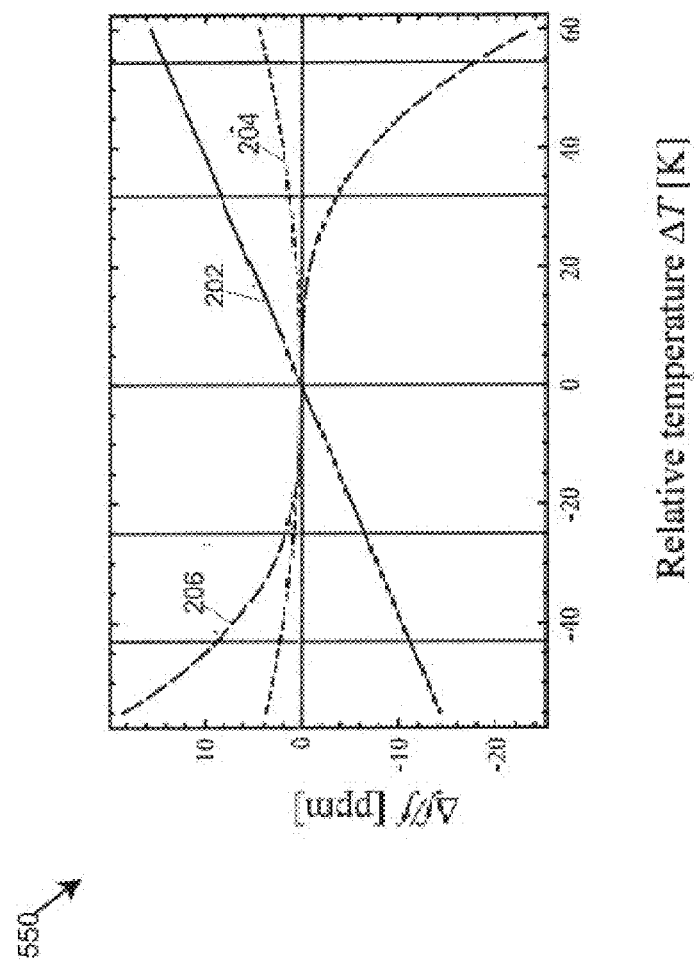

FIG. 2B provides, in the form of graph 550, greater detail with respect to a single temperature dependent curve of the type from FIG. 2A, separating the frequency response into the various contributions, including first order 202, second order 204 and third order 206 contributions. These different temperature dependencies can be related to, for example, the temperature dependencies of the resonator material, the electrode materials, stress effects, and mounting. As with FIG. 2A, the y-axis represents the frequency change Δf/f in ppm. The x-axis represents the relative temperature ΔT in Kelvin.

Figure 2C:
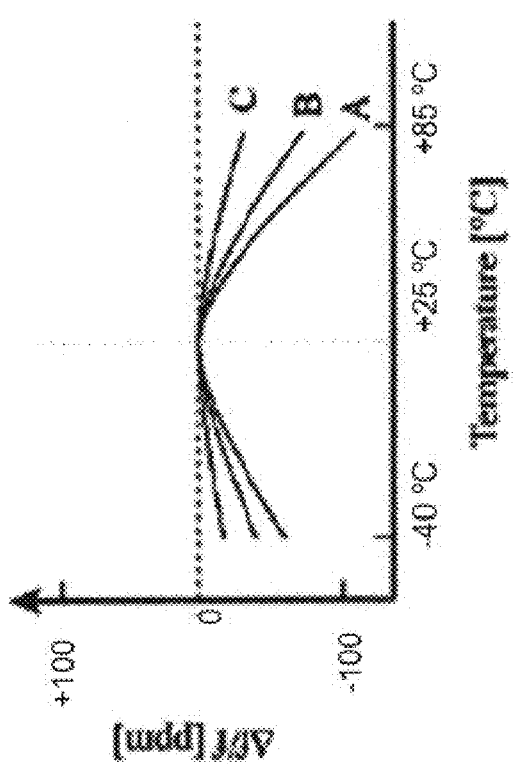

FIG. 2C focuses on the second order contributions to the temperature dependent curves A-C of FIG. 2A. The x-axis represents temperature in degrees Celsius. The y-axis represents the frequency change Δf/f in ppm. As shown, the second order contributions may, in this non-limiting example, result in instability up to approximately 100 ppm over the temperature operating range of the mechanical resonating structure. It may be desirable to provide a mechanical resonating structure with greater frequency stability, for example ±20 ppm, ±10 ppm, ±5 ppm or ±2.5 ppm over the entire temperature range from −40° C. to +85° C. The techniques described herein for compensating second order temperature dependent frequency behavior may be used to provide such stability.

It should be noted that there is a significant difference between compensating the second order contribution to temperature dependent frequency operation of a mechanical resonating structure and compensating a linear first order contribution. Compensating one of the two does not necessarily compensate the other, and in fact in most scenarios compensating one of the two does not compensate the other. Even if a first order contribution is compensated, the second order contribution may remain, and vice versa. Moreover, compensating one may actually worsen the other. For example, compensating a second order contribution to the temperature dependent frequency behavior of a mechanical resonating structure according to one or more of the aspects described herein may in fact increase the first order linear contribution, thus increasing overall frequency instability of the mechanical resonating structure absent compensation of the first order contribution. As a non-limiting example, doping a semiconductor material (or altering the doping-level) of a mechanical resonating structure may improve (i.e., make smaller) the amplitude of the second order temperature coefficient of frequency (TCF2) while making worse (i.e., increasing) the amplitude of the first order temperature coefficient of frequency (TCF1). Thus, as explained further below, according to one aspect of the present application the second order quadratic contribution is compensated using one technique (e.g., doping of one or more components of a mechanical resonating structure) and a second technique (e.g., adjusting thickness ratios of layers of a stack of materials forming part or all of the mechanical resonating structure) is used to compensate for the first order linear contribution.

According to one aspect of the present application, one or more components of a mechanical resonating structure are doped to compensate second order contributions to the temperature dependent frequency behavior of the mechanical resonating structure. The mechanical properties of many materials, such as the stiffness coefficient of a material, may depend on the charge carrier concentration within that material. For example, the charge carrier concentration within a semiconductor material may impact the stiffness coefficient of the material. Accordingly, applicants have appreciated that the mechanical properties (e.g., stiffness over temperature) of components of a mechanical resonating structure may be controlled by doping the component(s) with a suitable type and level of dopant (e.g., changing the doping level of a suitable dopant type), thus allowing control of the temperature dependent frequency operation of any mechanical resonating structure including such components. A non-limiting example is given with respect to FIG. 3.

Figure 3:
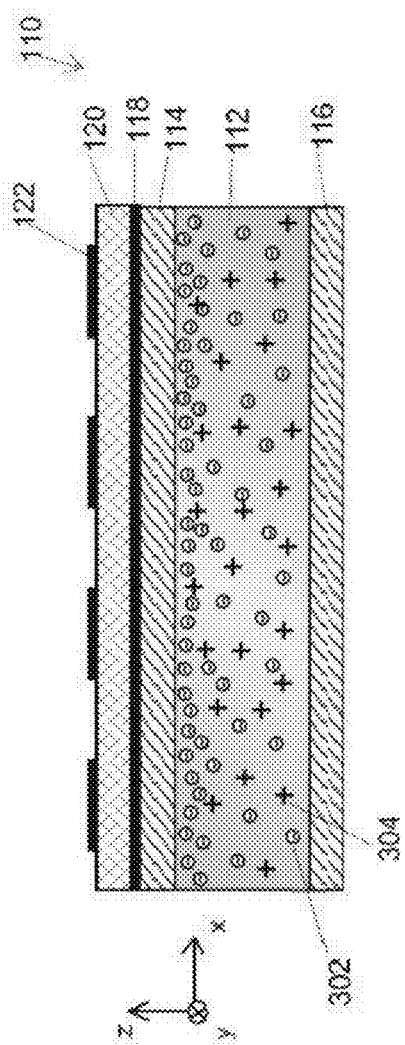
FIG. 3 illustrates a doped mechanical resonating structure according to one non-limiting embodiment.
Figure 4:
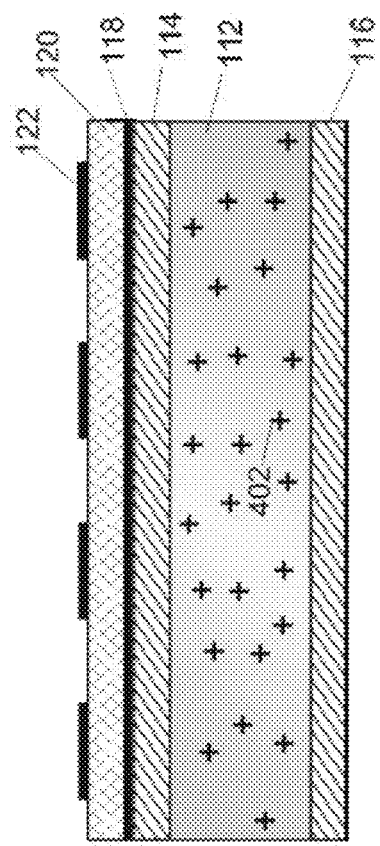
FIG. 4 illustrates an alternative to FIG. 3, in which the silicon layer 112 is doped with positive charge carriers.

FIG. 3 illustrates the mechanical resonating structure of FIGS. 1A and 1B, with greater detail given with respect to the charge carrier concentration within the silicon layer 112 (which, again, may be any semiconductor material as silicon is a non-limiting example). As shown, the silicon layer 112 includes negative charge carriers 302 and positive charge carriers 304. The concentration of the negative charge carriers may be greater than that of the positive charge carriers in this non-limiting embodiment due to doping the silicon layer 112 (i.e., the silicon layer 112 may be doped N-type). As a result, the stiffness coefficient of the silicon layer 112 may be altered to the point at which part or all of the micromechanical resonating structure 110 exhibits minimal or substantially zero second order contribution to its temperature dependent frequency behavior. In some embodiments, the amplitude of the TCF2 may be improved (lowered) by a factor of approximately 1.5, 2, or 3 (as non-limiting examples), irrespective of whether the ultimate TCF2 value is substantially zero. FIG. 4 illustrates an alternative to FIG. 3, in which the silicon layer 112 is doped with positive charge carriers 402, resulting in a different temperature behavior of stiffness than that for the doping configuration of FIG. 3.

The material doped is not limiting. As mentioned above, a non-limiting example is to dope a semiconductor material, such as silicon. However, other semiconductor materials may be used in a mechanical resonating structure, such as germanium, and any such semiconductor material may be doped according to the present aspect of the technology. A non-limiting example is to dope germanium with an n-type dopant. Also, as described further below, materials other than semiconductor materials may be used in a mechanical resonating structure and may be doped.

The type of dopant used is not limiting. For example, dopants commonly used in semiconductor processing may be used, such as boron and phosphorus (e.g., when a semiconductor material is the material being doped). N-type dopants include P, As, Sb, and Bi, among others. P-type dopants include B, Al, In and Ga, among others. As a non-limiting example, Potassium may be used as a dopant to dope $SiO_2$, for example silicon oxide layers 114 and 116 of micromechanical resonating structure 110. Other types of dopants may also be used, and the type of dopant selected may depend on the type of charge carrier desired (i.e., negative charge carriers or positive charge carriers) and the type of material being doped (e.g., a semiconductor material, a dielectric material, metal, or any other suitable material).

The amount (or level) of doping, or the doping concentration, used according to the present aspect of the application may be any suitable amount for compensating a second order contribution to the temperature dependent frequency behavior of the mechanical resonating structure. The amount of dopant may depend, therefore, on the type of material being doped, the orientation of the crystal structure of the materials, the thickness of the material relative to other layers within the mechanical resonating structure, the type of dopant used, and the magnitude of the second order contribution of the material stiffness to the TCF absent the doping. Thus, the various aspects described herein relating to doping a material of a mechanical resonating structure to compensate the second order contribution to the temperature dependent frequency behavior of the mechanical resonating structure are not limited to any particular level of dopant. Furthermore, as described in greater detail below, a uniform level of dopant need not be used. That said, in some embodiments the doping level may be high and make the semiconductor degenerate, for example greater than $10^{19}$ dopants/cm$^3$, $10^{20}$ dopants/cm$^3$, between $1 \cdot 10^{16}$ and $5 \cdot 10^{21}$ dopants/cm$^3$, or any other suitable value. According to some non-limiting embodiments, the doping level may be between $10^{14}$ dopants/cm$^3$ and $5 \cdot 10^{21}$ dopants/cm$^3$, though other values are also possible.

Any suitable component of a mechanical resonating structure may be doped (or the doping level may be controlled) according to the present aspect of the application. As illustrated in FIG. 3, the micromechanical resonating structure 110 includes conducting layer 118 and electrodes 122, a piezoelectric material active layer 120, silicon oxide layers 114 and 116, and silicon layer 112. Any one or more of these components may be doped for the purpose of compensating a second order contribution to the temperature dependent frequency behavior of the mechanical resonating structure. In general, some materials may exhibit greater changes in their mechanical properties as a result of doping than others, and therefore it may be preferable in some embodiments to dope materials of the mechanical resonating structure that exhibit the greatest change in their mechanical properties. For example, semiconductors generally exhibit a relatively large change in their stiffness coefficient as a result of changes in charge carrier concentration, such that it may be preferable in some embodiments to dope a semiconductor layer of a mechanical resonating structure (e.g., silicon layer 112 of micromechanical resonating structure 110). It should be appreciated, however, that the various aspects described herein relating to doping components of mechanical resonating structures are not limited to doping any particular components unless otherwise stated, and that more than one component may be doped for the purpose of compensating a second order contribution to the temperature dependent frequency behavior of the mechanical resonating structure.

It should also be appreciated that the various aspects described herein relating to doping components of a mechanical resonating structure are not limited to using any particular doping configuration. FIGS. 3 and 4 illustrated non-limiting examples in which doping may be graded or substantially uniform, respectively, through a thickness of the silicon layer 112. More generally, uniform doping or non-uniform doping (e.g., graded doping, buried layer doping, etc.) with respect to a vertical dimension (i.e., thickness, in the z-direction of FIGS. 3 and 4) of a mechanical resonating structure may be used. Alternatively, or in addition, lateral doping patterns may also be used, i.e., patterns of dopants that differ within the x-y plane illustrated in FIG. 3. Such laterally non-uniform doping may be advantageous if the doping level is restricted by the applied process and/or the user wants to make use of the specific local sensitivity in the x-y plane of the mode of operation of the resonating structure. Moreover, doping locally in the x-y plane may be used to confine resonant energy in a certain area of the mechanical resonating structure, e.g., away from the boundaries of the resonating structure.

Figure 5:
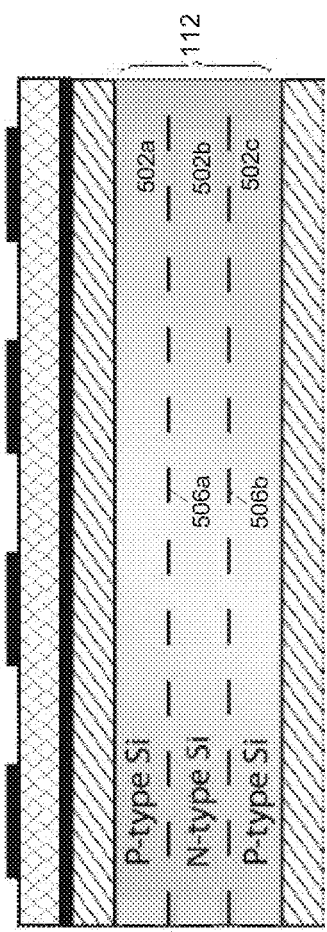
FIG. 5 illustrates an alternative doping configuration for the mechanical resonating structure of FIG. 3.

As mentioned, the doping configurations illustrated in FIGS. 3 and 4 are non-limiting examples, and alternatives are possible. For example, FIG. 5 illustrates an alternative doping configuration of the mechanical resonating structure 110 in which the silicon layer 112 has an intrinsic N-type doping, and is subsequently doped to form P-type regions 502a and 502c surrounding an N-type region 502b. The doping arrangement results in formation of a first PN junction 506a between the P-type region 502 and the N-type region 502b, as well as a second PN junction 506b between the N-type region 502b and the P-type region 502c. The illustrated doping configuration may result in the respective regions 502a-502c within silicon layer 112 exhibiting different temperature coefficients of frequency. Suitable selection of the type and amount of doping may be made to result in desired compensation of a second order contribution to the temperature dependent frequency behavior of the mechanical resonating structure.

A further non-limiting alternative is illustrated in FIG. 6, which shows a top view of a mechanical resonating structure 602 having a laterally non-uniform doping pattern. As shown, the mechanical resonating structure 602 is rectangular in this non-limiting example, having a length L and a width W. The illustrated surface may represent, as a non-limiting example, an active layer of the mechanical resonating structure. The active layer may be doped with the doping pattern 604, e.g., $10^{19}$ dopants/cm$^3$ of Boron, as a non-limiting example. Thus, a non-uniform doping with respect to the lateral dimensions W and L is shown. The shape of the doping pattern shown in FIG. 6 is non-limiting, as other shapes are possible.

Figure 7A:
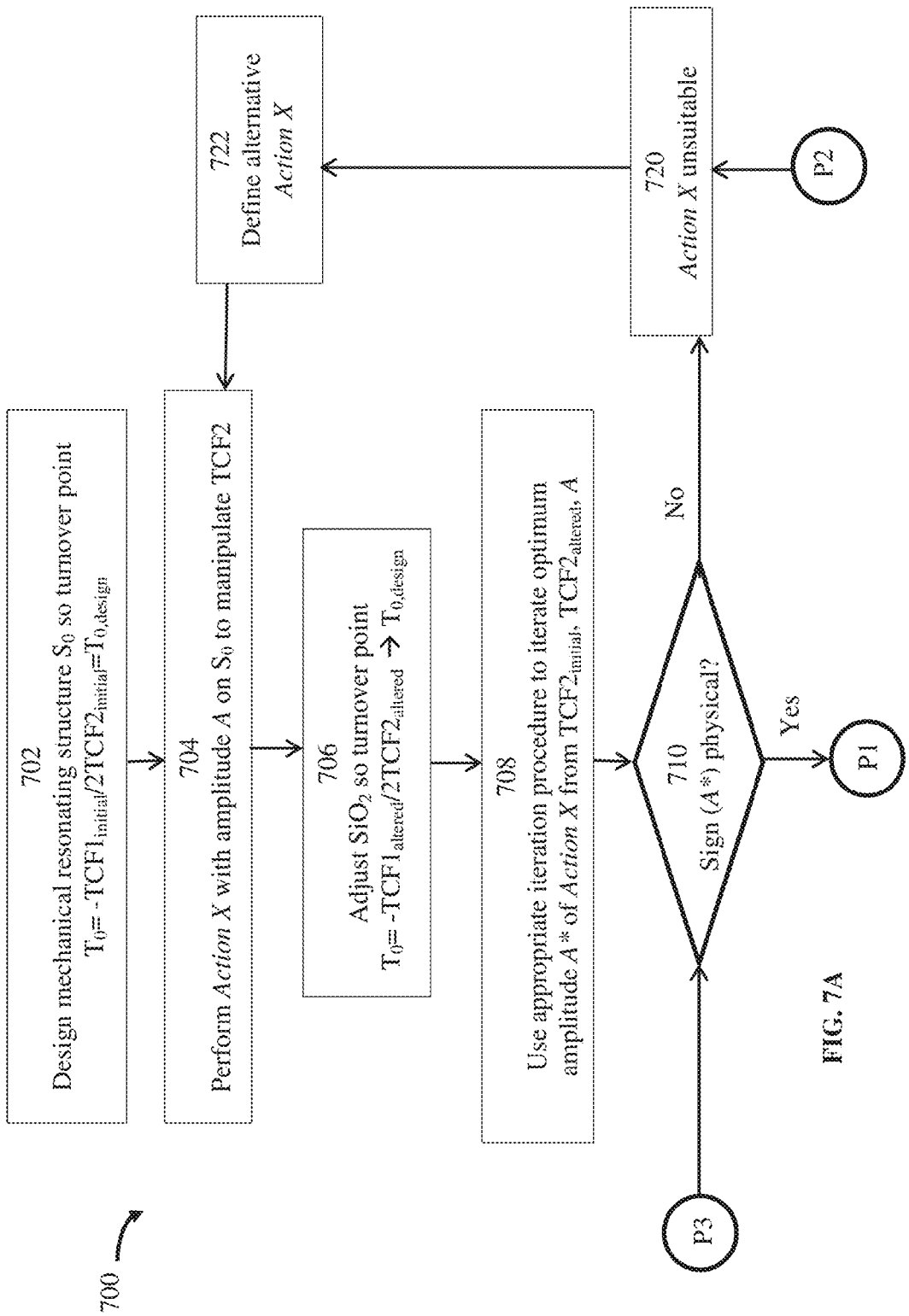
FIGS. 7A and 7B represent a combined flowchart illustrating an exemplary method for compensating second order temperature dependent frequency behavior of a mechanical resonating structure, according to one non-limiting embodiment.
Figure 7B:
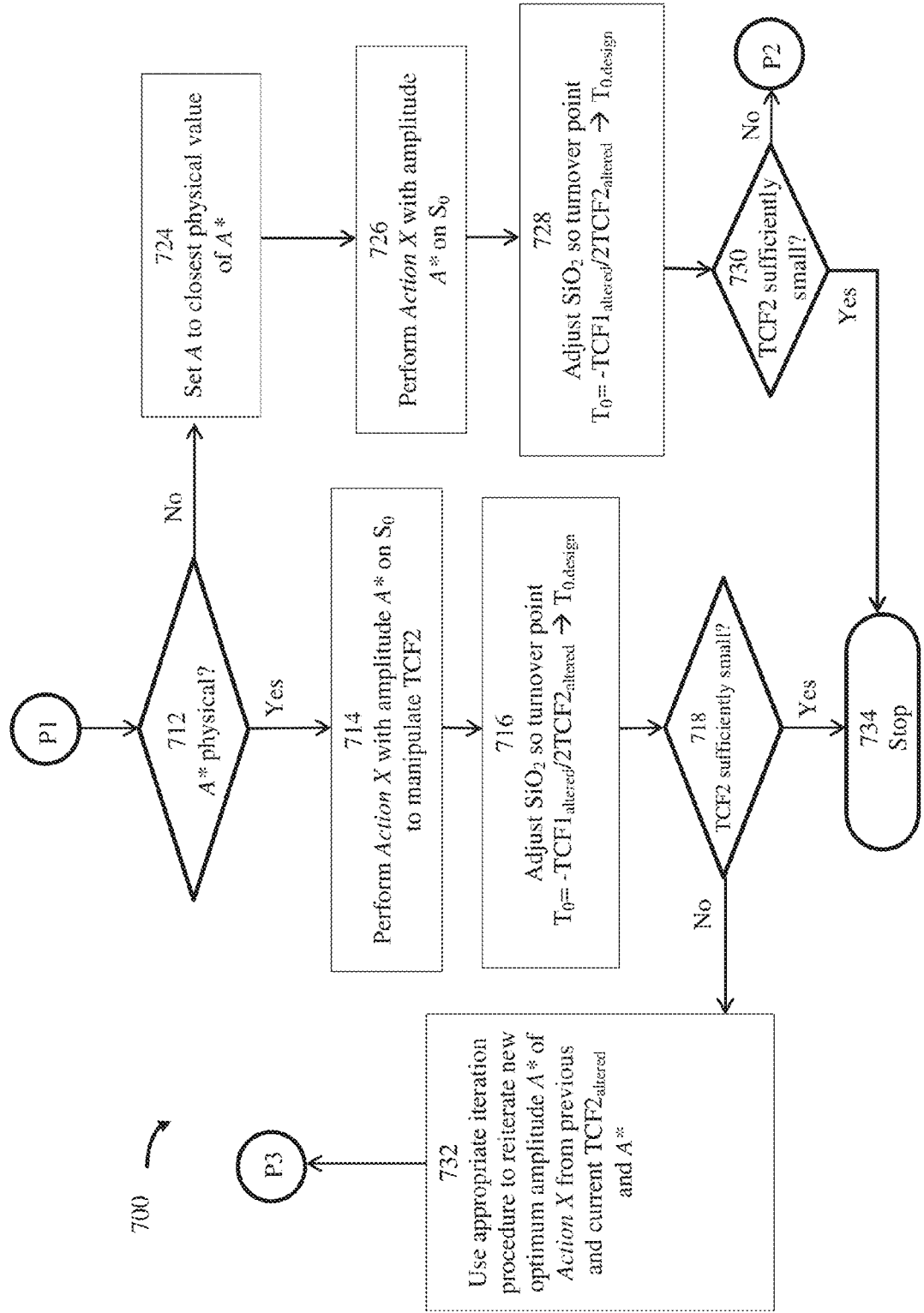

FIGS. 7A and 7B in combination illustrate a non-limiting example of a methodology which may be used to determine a suitable amount and configuration of doping of a component of a mechanical resonating structure to compensate the second order contribution to the temperature dependent frequency behavior of that mechanical resonating structure. Referring to FIG. 7A, the method 700 may begin at 702 by designing the mechanical resonating structure stack "S$_0$" so that the turnover point $T_0 = -TCF1_{initial}/2TCF2_{initial} = T_{0,Design}$. This value for $T_0$ may be designated as $T_{0,design}$. The turnover point ($T_0$) represents the most shallow point of the temperature dependent frequency behavior of the mechanical resonating structure. TCF1 represents the first order temperature coefficient of frequency and TCF2 represents the second order temperature coefficient of frequency, as explained above. Thus, TCF1$_{initial}$ represents the initial TCF1 corresponding to the initial mechanical resonating structure design from 702. Likewise, TCF2$_{initial}$ represents the initial TCF2 corresponding to the initial mechanical resonating structure design from 702. "S$_0$" represents the initial mechanical resonating structure stack design, for example the thicknesses of any semiconductor, active, and oxide layers (such as silicon layer 112, silicon oxide layers 114 and 116, active layer 120, etc.). As will be appreciated from the following discussion, the method 700 assumes that there is at least one silicon oxide layer, though it should be appreciated not all embodiments are limited in this respect.

The method may proceed at 704 by performing an "Action X" having an amplitude A on the initial mechanical resonating structure stack design S$_0$, which may effectively manipulate TCF2. It should be appreciated that performance of Action X with amplitude A at 704 may influence TCF1 of the mechanical resonating structure in addition to influencing TCF2.

"Action X" represents the desired action for altering the second order temperature coefficient of frequency of the mechanical resonating structure. For ease of explanation, it is assumed in the following discussion of FIG. 7 that "Action X" corresponds to doping a material of the mechanical resonating structure (e.g., doping a semiconductor layer of the mechanical resonating structure). However, it should be appreciated that "Action X" may alternatively be any of the other types of actions described herein for altering TCF2, some of which are described further below. Briefly, non-limiting examples of Action X may include dielectric polarization of a layer of the mechanical resonating structure, ion implantation of one or more layers of a mechanical resonating structure, stressing of layers, etc.

In FIGS. 7A and 7B, "A" represents the amplitude of the "Action X." For example, the "amplitude" of doping a material may refer to the level of doping to use. As another non-limiting example, if "Action X" is the application of stress to part or all of the mechanical resonating structure (as described below), then the "amplitude" may be the amount of external or internal applied stress. If Action X corresponds to ion implantation of one or more layers, then A may represent the amount of ion implantation performed.

At 706, the thickness of the silicon oxide layer(s) of the mechanical resonating structure (e.g., silicon oxide layers 114 and/or 116) may be adjusted until the turnover point $T_0 = -TCF1_{altered}/2TCF_{altered}$ converges to $T_{0,design}$. $TCF1_{altered}$ represents TCF1 of the mechanical resonating structure after being altered by act 706. $TCF2_{altered}$ represents TCF2 of the mechanical resonating structure after being altered by act 706.

At 708, an appropriate iteration procedure is used to iterate the optimum amplitude A* of Action X from $TCF2_{initial}$, $TCF2_{altered}$, and A. A* represents the adjusted best guess for the amplitude A, for example referring to an adjusted doping level after determination that the initial doping level A does not provide the desired behavior.

As shown, at 710 a determination is made as to whether the sign of A* is physical. If the answer is yes, then method 700 proceeds to P1 which, as shown in FIG. 7B, moves to act 712. At act 712 a determination is made as to whether A* is physical. If A* is physical, then the method 700 proceeds to 714, at which Action X is performed with an amplitude A* on the mechanical resonating structure stack design $S_0$, to manipulate TCF2 of the mechanical resonating structure. Performance of act 714 may alter TCF1 as well.

The method 700 then proceeds to 716, at which the thickness of the silicon oxide layer(s) of the mechanical resonating structure (e.g., silicon oxide layers 114 and/or 116) may be again adjusted until the turnover point $T_0 = -TCF1_{altered}/2TCF_{altered}$ converges to the original $T_{0,design}$. $TCF1_{altered}$ in act 716 represents the current TCF1 of the mechanical resonating structure after act 716. $TCF2_{altered}$ in act 716 represents TCF2 of the mechanical resonating structure after act 716.

At 718, a determination is made whether TCF2 is sufficiently small. The answer may depend on particular specifications to which the mechanical resonating structure is being designed, or may be based on any other suitable considerations. If TCF2 is sufficiently small, the method stops at 734. If not, the method loops back with act 732 at which an appropriate iteration procedure is utilized to determine the optimum amplitude of A* for the next iteration consisting of acts 710, 712, 714, 716, and 718 (via P3 in the figures). Any selected iteration procedure may utilize the TCF2 of the previous iteration (and/or the initial $TCF2_{initial}$) the current $TCF2_{altered}$, and the value of A* of the previous iteration loop as of act 732 (and/or the initial A) and the current A*.

If it is determined at 710 that the signal of A* is not physical, then the method 700 moves to 720, at which it is determined that the Action X is an unsuitable action for sufficiently improving the temperature dependent frequency behavior of the mechanical resonating structure. An alternative type of Action X may then be selected at 722 and the method may return to 704.

If it is determined at 710 that the sign of A* is physical, but it is then determined that A* is not physical at 712, then the method 700 proceeds to 724 at which A is set to the closest physical value of A*. From act 724, the method proceeds to 726, at which Action X is performed with amplitude A*, which may alter both TCF1 and TCF2. At 728 the thickness of the silicon oxide layer(s) of the mechanical resonating structure (e.g., silicon oxide layers 114 and/or 116) may be adjusted until the turnover point $T_0 = -TCF1_{altered}/2TCF_{altered}$ converges to $T_{0,design}$. $TCF1_{altered}$ at act 728 represents TCF1 of the mechanical resonating structure after being altered by act 728. $TCF2_{altered}$ at act 728 represents TCF2 of the mechanical resonating structure after being altered by act 728.

From act 728, the method 700 proceeds to 730 at which a determination is made whether TCF2 is sufficiently small. If yes, then the method may stop at 734. If not, then the method may return to 720 (in FIG. 7A) via point P2.

It should be appreciated that the method 700 is a non-limiting example of a suitable manner in which the appropriate doping level (or magnitude of other compensating actions) of a mechanical resonating structure may be determined to compensate second order temperature dependent frequency behavior. Other methods are also possible, and the various aspects described herein are not limited to the methodology of FIGS. 7A and 7B.

Doping one or more materials of a mechanical resonating structure according to the present aspect may produce a beneficial reduction in the second order contribution to the TCF of the mechanical resonating structure. For example, the frequency stability of a mechanical resonating structure may be improved from, for example, +/−100 ppm over a desired operating temperature range to +/−5-20 ppm, or to +/−0.5-2 ppm, or less. Other amounts of improvement may also be realized, as those numbers listed above are merely exemplary. Thus, the improvement may be significant.

According to another aspect, ion implantation may be used to alter the mechanical properties (e.g., stiffness over temperature) of a material of a mechanical resonating structure. Ion implantation may operate in a manner similar to doping, as described above, and any suitable type, level, and configuration of ion implantation may be used. Any one or more components of a mechanical resonating structure may be ion implanted to impact the temperature behavior. Thus, those aspects described herein relating to ion implantation of a mechanical resonating structure to impact its frequency behavior are not limited to the type, components, level, or configuration of ion implantation.

According to another aspect, internal and/or external stressing of layers of a mechanical resonating structure is used to compensate the second order quadratic contribution to the temperature dependent frequency behavior of a mechanical resonating structure. As a non-limiting example, the residual stress in one or more layers of a mechanical resonating structure may be controlled by suitable fabrication of the structure to compensate for temperature dependent frequency behavior of the mechanical resonating structure. According to another non-limiting embodiment, the substrate on which the mechanical resonating structure is mounted and/or the whole package of a mechanical resonating structure (e.g., the package of a MEMS resonator) may be designed to exert external stress on the mechanical resonating structure sufficient to compensate for temperature dependent frequency behavior of the mechanical resonating structure. The amount of internal or external stress to be applied to the mechanical resonating structure is not limiting, as any suitable amount to provide a desired level of compensation of temperature dependent behavior of the mechanical resonating structure may be used.

Use of internal and/or external stressing of components of the mechanical resonating structure may impact the temperature dependent behavior of the mechanical resonating structure by taking advantage of geometric nonlinearities (i.e., the impact on the resonance frequency of the mechanical resonating structure due to changes in the shape of the structure, such as may occur with a clamped-clamped beam) and/or material nonlinearities, namely the acoustic-elastic effect.

The effective elastic stiffness (dominating the temperature behavior of frequency) of a material can be expressed as:

$$C_{eff} = C_{eff,0}(1 + TCC1 \cdot T + TCC2 \cdot T^2) + K \in,$$

where TCC1 and TCC2 are first and second order temperature coefficients of the stiffness, $C_{eff,0}$ is the effective stiffness coefficient (unstressed and at a reference temperature), K is an effective elastic-acoustic coefficient with temperature dependence $K = K_0(1 + K_1 T)$ and $\in$ is the effective applied strain. As $\in = \alpha^* T$, where $\alpha^* = (\alpha_{ext} - \alpha_{int})$ is the external imposed thermal expansion, which again is temperature dependent with $\alpha^* = \alpha_0^*(1 + \alpha_1 T)$, it can be derived that $$C_{eff} = C_{eff,0}(1 + TCC1 \cdot T + TCC2 \cdot T^2) + K_0 \alpha_0^*(1 + \alpha_1 T)(1 + K_1 T)T$$

and for the temperature coefficient we can derive that $$TCC_{eff} = TCC1 + K_0 \alpha_0^* / C_{eff,0} + 2(TCC2 + K_0 \alpha_0^* / C_{eff,0} [K_1 + \alpha_1])T$$

where the first two terms $TCC1 + K_0\alpha_0^*/C_{eff,0}$ are responsible for the first order temperature behavior and the $3^{rd}$ term is responsible for the second order temperature behavior. Applying internal and/or external stresses according to the present aspect of the technology may be done in a manner so that $TCC2 + K_0\alpha_0^*/C_{eff,0}[K_1 + \alpha_1] = 0$, namely using the $1^{St}$ order temperature dependence of the elastic-acoustic coefficient and the thermal expansion mismatch to compensate for the $2^{nd}$ order temperature dependence of the stiffness. In the above equations, $\alpha_{ext}$ is the external thermal explanation coefficient (e.g., of the stack of layers forming the mechanical resonating structure), $\alpha_{int}$ is the intrinsic/internal thermal expansion coefficient (e.g., of the silicon layer 112), $\alpha^*_0$ is the thermal expansion mismatch, and $\alpha_1 T$ is the temperature dependence of the thermal expansion mismatch. $K_0$ is the value of K at a reference temperature and $K_1$ is the first temperature coefficient of K.

It should be appreciated that the elastic-acoustic coefficient has a very strong temperature dependence. It further should be appreciated that by appropriate configuration of the stack $\alpha_0^*$ can have as well positive as negative sign. It further should be appreciated that $K_0$ can have as well positive as negative sign, depending on the main mode of vibration.

It further should be appreciated that temperature dependence that magnitude and sign of $K_0$, $K_1$ can be controlled by doping in semiconductor layers such as e.g. silicon.

Internal/external stressing of components of the mechanical resonating structure, as described above, may be applicable to any component of a mechanical resonating structure. For example, such stressing may impact the temperature behavior of a semiconductor material of a mechanical resonating structure, a dielectric material, or metal. Thus, one or more components of a mechanical resonating structure may be stressed to provide a desired level of temperature compensation.

According to another aspect, dielectric polarization of materials of a mechanical resonating structure is used to alter the second order quadratic temperature dependent behavior of the mechanical resonating structure. A large bias voltage may be applied to a suitable material of a mechanical resonating structure, such as a ferroelectric material if any such material is used in the mechanical resonating structure, to polarize the material to a certain amount. The bias voltage may thus alter the mechanical properties, such as stiffness, of the dielectric. Any suitable bias voltage may be used to achieve a desired change in the mechanical properties of the dielectric material, and thus the aspects described herein relating to application of a bias voltage to a dielectric material are not limited to application of any particular bias voltages. Non-limiting examples of dielectric materials which may be used in a mechanical resonating structure and which may be polarized according to the present aspect include $BaTiO_3$, $LbNO_3$, and PZT.

According to another aspect, one or more materials of a mechanical resonating structure are annealed to influence elastic temperature behavior of the material. Annealing under certain conditions, such as at a certain temperature and environment profile, may suitably influence the elastic temperature behavior of a material of a mechanical resonating structure such that the temperature dependent behavior of the material is compensated. Annealing is a valid process for semiconductors, dielectrics, and metals and thus may be used on one or more components of a mechanical resonating structure, such as mechanical resonating structure 110 or any other suitable mechanical resonating structure.

As mentioned previously, the second order quadratic contribution to the temperature dependent frequency behavior of a mechanical resonating structure may be compensated according to one or more aspects described herein. In addition, various techniques may be used to compensate a first order linear contribution to the temperature dependent frequency behavior. For example, referring to micromechanical resonating structure 110, the silicon layer 112 and silicon oxide layers 114 and 116 may, in combination, form a temperature compensation structure suitable for compensating a first order linear contribution to the temperature dependent behavior of the resonator. For example, U.S. patent application Ser. No. 12/639,161 filed on Dec. 16, 2009, entitled MECHANICAL RESONATING STRUCTURES INCLUDING A TEMPERATURE COMPENSATION STRUCTURE, and published as U.S. Patent Application Publication No. US-2010-0182102-A1 on Jul. 22, 2010, and issued as U.S. Pat. No. 8,058,769, incorporated herein by reference in its entirety, describes suitable temperature compensation structures which may be used to compensate first order linear temperature dependent behavior of a mechanical resonating structure. Thus, according to one aspect, the second order quadratic contribution to the temperature dependent behavior of a mechanical resonating structure is compensated using one or more of the techniques described herein, while a temperature compensation structure as described in U.S. patent application Ser. No. 12/639,161 may be used to compensate a first order linear contribution to the temperature dependent behavior of the mechanical resonating structure. In this manner, both the first and second order contributions to the temperature dependent behavior of the mechanical resonating structure may be compensated, thus providing high frequency stability over a wide range of operating temperatures.

The mechanical resonating structures described herein may be used as stand-alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structures described are integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some embodiments, one or more of the devices described herein may form part or all of a MEMS.

Having thus described several aspects of at least one embodiment of this application, it is to be appreciated that various alterations, modifications, and improvements will readily occur to those skilled in the art. Such alterations, modifications, and improvements are intended to be within the spirit and scope of the various aspects described herein.

In addition, while some references have been incorporated herein by reference, it should be appreciated that the present application controls to the extent the incorporated references are contrary to what is described herein.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A mechanical resonating structure, comprising:
a plurality of stacked layers, comprising
a piezoelectric material active layer;
a plurality of electrodes configured to actuate the piezoelectric material active layer by applying thereto an excitation signal; and
a doped semiconductor layer coupled to the piezoelectric material active layer and coupled to a substrate by at least one anchor,
wherein thicknesses of the plurality of stacked layers combine to provide a first order temperature coefficient of frequency (TCF) that is approximately zero for a mode of vibration, and
wherein the doped semiconductor layer has a doping concentration with a value configured to provide the mechanical resonating structure with a second order TCF that is substantially zero for the mode of vibration.

2. The mechanical resonating structure of claim 1, wherein the doped semiconductor layer is a silicon layer.

3. The mechanical resonating structure of claim 1, wherein the plurality of electrodes comprises an interdigitated transducer (IDT) on an upper surface of the piezoelectric material active layer.

4. A mechanical resonating structure, comprising:
a piezoelectric material active layer;
a plurality of electrodes configured to actuate the piezoelectric material active layer by applying thereto an excitation signal; and
a semiconductor layer coupled to the piezoelectric material active layer and coupled to a substrate by at least one anchor,
wherein the semiconductor layer is doped so that a mode of vibration of the mechanical resonating structure has a second order temperature coefficient of frequency (TCF) that is substantially zero, and
wherein the plurality of electrodes comprises an interdigitated transducer (IDT) on an upper surface of the piezoelectric material active layer, wherein the plurality of electrodes further comprises a ground electrode, wherein the piezoelectric material active layer is configured between the IDT and the ground electrode, and wherein the mechanical resonating structure further comprises a first oxide layer and a second oxide layer, wherein the semiconductor layer is disposed at least partially between the first oxide layer and the second oxide layer, wherein the first oxide layer is disposed at least partially between the semiconductor layer and the ground electrode.

5. The mechanical resonating structure of claim 1, wherein the mode of vibration is a primary mode of vibration of the mechanical resonating structure.

6. The mechanical resonating structure of claim 1, wherein the plurality of electrodes are configured to actuate the piezoelectric material active layer to exhibit lateral vibration in a lateral direction.

7. The mechanical resonating structure of claim 6, wherein the doped semiconductor layer has a thickness substantially perpendicular to the lateral direction, and wherein the doped semiconductor layer has a doping pattern which varies across the thickness.

8. The mechanical resonating structure of claim 7, wherein the doping pattern defines a pn junction.

9. The mechanical resonating structure of claim 6, wherein the doped semiconductor layer has a thickness substantially perpendicular to the lateral direction and a lateral dimension substantially parallel to the lateral direction, and wherein the doped semiconductor layer has a doping pattern which varies across the lateral direction.

10. The mechanical resonating structure of claim 1, wherein the piezoelectric material active layer and/or the plurality of electrodes are doped.

11. The mechanical resonating structure of claim 1, wherein the mechanical resonating structure further comprises a first oxide layer and a second oxide layer, wherein the doped semiconductor layer is disposed at least partially between the first oxide layer and the second oxide layer.

12. The mechanical resonating structure of claim 1, wherein the doping concentration has a value between $10^{19}$ and $10^{21}$ donors/cm$^3$.

13. The mechanical resonating structure of claim 1, wherein the doping concentration has a value between $10^{19}$ and $10^{21}$ acceptors/cm$^3$.

14. The mechanical resonating structure of claim 1, wherein the doped semiconductor layer has a doping concentration with a value configured to provide the mechanical resonating structure with a second order TCF that is substantially zero for the mode of vibration over an entire range from −40° C. to 85° C.

15. The mechanical resonating structure of claim 4, wherein the semiconductor layer is doped to a concentration between $10^{19}$ and $10^{21}$ donors/cm$^3$.

16. The mechanical resonating structure of claim 4, wherein the semiconductor layer is doped to a concentration between $10^{19}$ and $10^{21}$ acceptors/cm$^3$.

17. The mechanical resonating structure of claim 4, wherein the plurality of electrodes are configured to actuate the piezoelectric material active layer to exhibit vibration in a lateral direction.

* * * * *